United States Patent
Zhao et al.

(10) Patent No.: US 12,046,283 B2
(45) Date of Patent: Jul. 23, 2024

(54) COMPUTE-IN-MEMORY ARRAY AND MODULE, AND DATA COMPUTING METHOD

(71) Applicant: ZHEJIANG UNIVERSITY, Zhejiang (CN)

(72) Inventors: Yi Zhao, Hangzhou (CN); Shifan Gao, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 132 days.

(21) Appl. No.: 17/841,689

(22) Filed: Jun. 16, 2022

(65) Prior Publication Data
US 2022/0319596 A1 Oct. 6, 2022

Related U.S. Application Data

(63) Continuation of application No. PCT/CN2019/126788, filed on Dec. 19, 2019.

(51) Int. Cl.
*G11C 13/00* (2006.01)
*G06N 3/063* (2023.01)
(Continued)

(52) U.S. Cl.
CPC ......... *G11C 13/0069* (2013.01); *G06N 3/063* (2013.01); *G11C 13/003* (2013.01);
(Continued)

(58) Field of Classification Search
None
See application file for complete search history.

(56) References Cited

U.S. PATENT DOCUMENTS

| 7,532,497 B2 * | 5/2009 | Kinoshita | G11C 13/0069 365/100 |
|---|---|---|---|
| 2004/0174732 A1 * | 9/2004 | Morimoto | G11C 16/0483 365/148 |

(Continued)

FOREIGN PATENT DOCUMENTS

| CN | 108092658 A | 5/2018 |
|---|---|---|
| CN | 108921290 A | 11/2018 |

(Continued)

OTHER PUBLICATIONS

International Search Report (PCT/CN2019/126788); Date of Mailing: Sep. 25, 2020.

*Primary Examiner* — Tan T. Nguyen
(74) *Attorney, Agent, or Firm* — W&G Law Group

(57) ABSTRACT

Disclosed are a compute-in-memory array and module, and a data computing method; a storage cell is configured to form an array used for computation; the storage cell consists of bitcells serially connected in sequence; a bitcell comprises a switching device and a resistive memory; the switching device is connected in series or in parallel with the resistive memory; the write resistance value of the storage cell is determined by means of controlling the switching state of the switching device so as to change the resistance state of the resistive memory. Since resistive memories have different resistance states, a resistive memory can be set in different resistance states by means of the switching state of the switching device, such that the storage cell is at a required write resistance value, thereby enabling the quick implementation of a write operation of the bitcell.

15 Claims, 5 Drawing Sheets

(51) Int. Cl.
*G11C 11/16* (2006.01)
*G11C 11/22* (2006.01)

(52) U.S. Cl.
CPC ....... *G11C 11/1675* (2013.01); *G11C 11/2275* (2013.01); *G11C 13/0004* (2013.01); *G11C 2213/79* (2013.01)

(56) References Cited

U.S. PATENT DOCUMENTS

| | | | | |
|---|---|---|---|---|
| 2007/0121369 | A1* | 5/2007 | Happ | H10B 63/32 365/148 |
| 2010/0182821 | A1* | 7/2010 | Muraoka | G11C 13/0069 365/189.011 |
| 2010/0202185 | A1* | 8/2010 | Katoh | G11C 13/0069 365/189.16 |
| 2016/0172024 | A1* | 6/2016 | Ma | G11C 11/5678 365/148 |
| 2016/0225819 | A1 | 8/2016 | Toh et al. | |

FOREIGN PATENT DOCUMENTS

| | | |
|---|---|---|
| CN | 109522753 A | 3/2019 |
| CN | 110390074 A | 10/2019 |

* cited by examiner

COMPUTE-IN-MEMORY ARRAY AND MODULE, AND DATA COMPUTING METHOD

CROSS-REFERENCE TO RELATED APPLICATIONS

The present application is a continuation of International Application No. PCT/CN2019/126788, filed on Dec. 19, 2019, the content of which is incorporated herein by reference in its entirety.

TECHNICAL FIELD

The present disclosure relates to the field of design of an integrated circuit, in particular to a compute-in-memory array and module and a data computing method.

BACKGROUND

Matrix multiplication is a common computation mode, which usually requires a lot of computation resources.

A neural network is an algorithm model that imitates the behavior characteristics of an animal neural network and carries out distributed parallel information processing. This algorithm model is widely used in the field of artificial intelligence.

In the process of neuromorphic computing, a large number of matrix operations are involved, and a storage computing integrated chip, also known as a brain-like chip or a synapse chip, emerges as the times require. It uses the current-voltage relationship between analog signals and analog storage array to perform large-scale matrix operations, and then simulates synaptic behaviors. The analog storage array is composed of a memory, and the analog value needs to be written into the memory first in every matrix operation. The writing process is realized by repeatedly comparing with a target current, and the writing operation takes a long time. In addition, the storage accuracy of the memory is limited, but in order to match the framework of the existing neural network deep learning, it is necessary for the analog memory to have a more state accuracy to be able to carry more information.

SUMMARY

In view of the above, the present disclosure aims to solve one of the above problems, and provides a compute-in-memory array and module and a data computing method to realize faster writing operations.

To achieve the above purpose, the present disclosure has the following technical solution:

A compute-in-memory array, including:

Atorage cells arranged in an array, each storage cell including a plurality of bitcells connected in series, each bitcell including a switching device and a resistive memory, the switching device is connected in series or in parallel with the resistive memory, and a write resistance value of the storage cell is determined by controlling the switching state of the switching device to change the resistance state of the resistive memory.

Signal terminals connected with two ends of the storage cells in the array, the signal terminals at one end of the storage cells are signal input terminals and connected in sequence along a first direction, and the signal terminals at the other end of the storage cells are signal output terminals and connected in sequence along a second direction.

Alternatively, the resistive memory includes a resistive random access memory, a phase change memory, a ferroelectric memory or a magneto resistive memory.

Alternatively, the switching device is connected in parallel with the resistive memory, and when a resistance value is written into the storage cell, the signal input terminal and the signal output terminal are configured to connect a bias voltage.

Alternatively, the switching device is connected in series with the resistive memory, and further a signal terminal is provided between the bitcells in the storage cell; when the resistance value is written into the storage cell, the signal terminals at two ends of the bitcell are configured to connect the bias voltage and write the resistance value into the bitcell.

Alternatively, when the resistance value is written into the storage cell, the reading and writing of all the bitcells are completed in an even-odd staggered manner.

Alternatively, each resistive memory has a different resistance state value.

Alternatively, the compute-in-memory array further includes an enabling device connected in series with the storage cells, the enabling device is configured to cause the storage cell to be in an off state in a case of an enabling signal.

Alternatively, the enabling device is a single MOS device or a CMOS transmission gate.

Alternatively, the switching device is a single MOS device or a CMOS transmission gate.

A data computing method, method, including carrying out computation by a compute-in-memory array, the compute-in-memory array includes: storage cells arranged in an array, each storage cell including a plurality of bitcells connected in series, each bitcell including a switching device and a resistive memory, the switching device is connected in series or in parallel with the resistive memory; two ends of the storage cells in the array are connected with signal terminals, the signal terminals at one end of the storage cells are signal input terminals and connected in sequence along a first direction, and the signal terminals at the other end of the storage cells are signal output terminals and connected in sequence along a second direction; the computing method includes the following steps:

Controlling writing of the storage cells, the writing includes: changing the resistance state of the resistive memory by controlling the switching state of the switching device to obtain a write resistance value of the storage cell.

Loading an input signal at the signal input terminal, and obtaining an output value from the signal output terminal, the output value is configured to represent a computed value.

Alternatively, the switching device is connected in parallel with the resistive memory, and when writing of the storage cell is implemented, the signal input terminal and the signal output terminal are configured to connect a bias voltage.

Alternatively, the switching device is connected in series with the resistive memory, and further a signal terminal is arranged between the bitcells in the storage cell; writing of the storage cell is implemented, the signal terminals at two ends of the bitcells are configured to connect the bias voltage and write the resistance value to the bitcell.

Alternatively, each resistive memory has a different resistance value.

A storage device, including:

Any above compute-in-memory array.

A writing control unit configured to control the writing of a storage cell, and the writing includes: changing the resistance states of different resistive memories by controlling the switching state of a switching device to obtain a write resistance value of the storage cell.

An input unit configured to load an input signal at a signal input terminal.

An output unit configured to obtain an output value from a signal output terminal, the output value is configured to represent a computed value.

The compute-in-memory array and module and data computing method provided by the present disclosure adopt storage cells to form an array for computing, the storage cells are composed of bitcells connected in series in turn, and the bitcell include a switching device and a resistive memory, and the switching device is connected in series or in parallel with the resistive memorie, and the write resistance value of the storage cell is determined by controlling the switching state of the switching device to change the resistance state of the resistive memory. As the resistive memory has different resistance states, the resistive memory can be set in different resistance states by means of the switching state of the switching device, so that the storage cell is at the required write resistance value, thereby enabling the quick implementation of a write operation of the bitcell.

Furthermore, each resistive memory in the storage cell can have a different resistance state value, so that the resistance of the serially connected storage cell can carry a larger amount of information and improve the accuracy of the storage cell.

BRIEF DESCRIPTION OF DRAWINGS

In order to more clearly explain the embodiments of the present disclosure or the technical solutions in the prior art, the drawings that need to be used in the description of the embodiments or the prior art will be briefly introduced below. Obviously, the drawings in the following description are some embodiments of the present disclosure. For those of ordinary skill in the art, other drawings can be obtained according to these drawings without any creative effort.

DESCRIPTION OF EMBODIMENTS

In order to make the above objects, features and advantages of the present disclosure more obvious and understandable, the specific embodiments of the present disclosure will be described in detail below with reference to the drawings.

In the following description, many specific details are set forth so that the present disclosure can be fully understood, but the present disclosure can be implemented in other ways different from those described here, and those skilled in the art can make similar promotion without violating the connotation of the present disclosure. Therefore, the present disclosure is not limited by the specific embodiments disclosed below.

Referring to FIGS. 1-5, this application proposes a compute-in-memory array, including:

Storage cells 10 arranged in an array, each storage cell 10 including a plurality of bitcells 12 connected in series, each bitcell 12 including a switching device T and a resistive memory R, the switching device T is connected in series or in parallel with the resistive memory R, and the write resistance value of the storage cells 10 is determined by controlling the switching state of the switching device T to change the resistance state of the resistive memory R.

Two ends of the storage cells 10 in the array are connected with the signal terminals, the signal terminals at one end are signal input terminals A and connected in sequence along a first direction, and the signal terminals B at the other end are signal output terminals and connected in sequence along a second direction.

Figure 1:
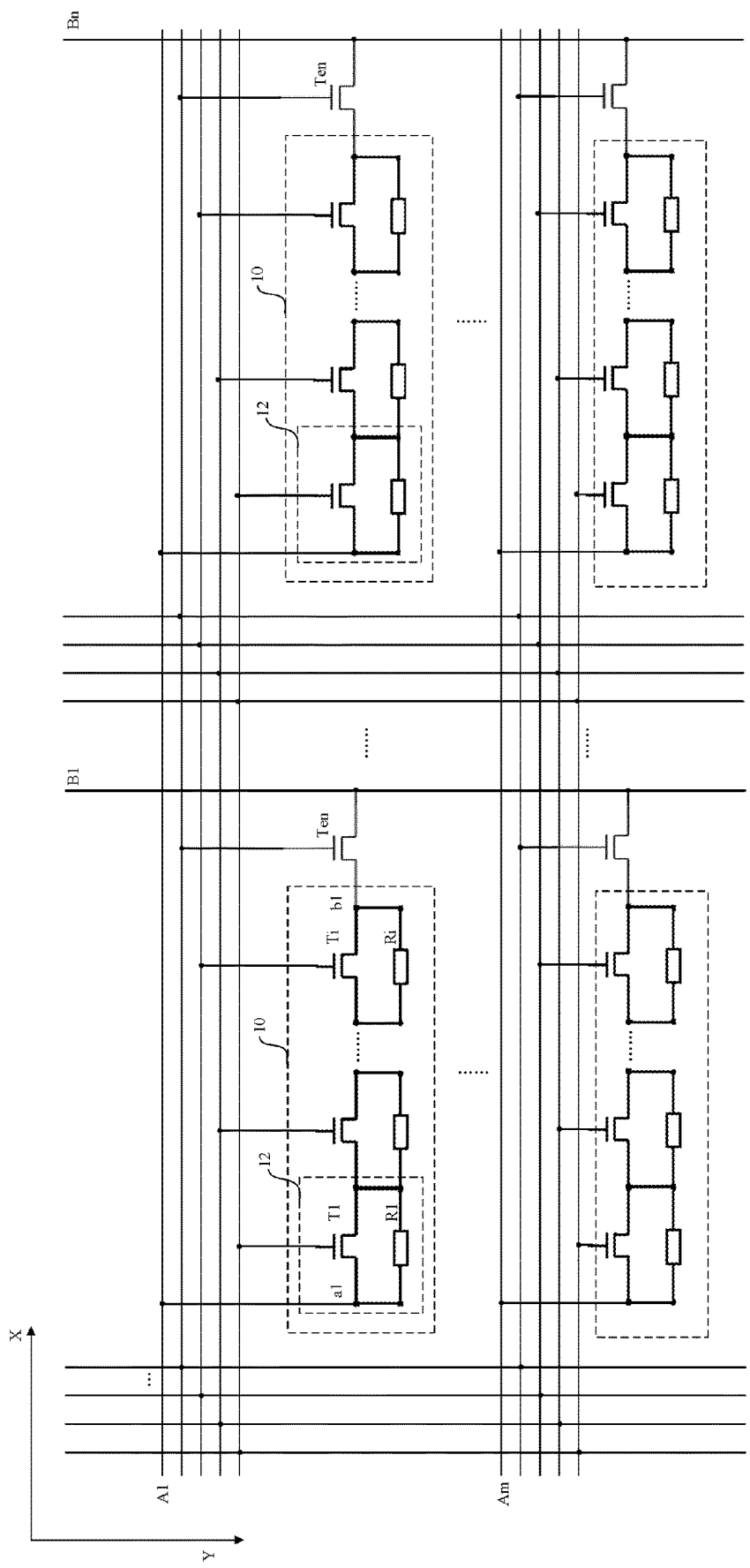
FIG. 1 shows a structural diagram of a compute-in-memory array according to Embodiment One of the present disclosure.
Figure 4:
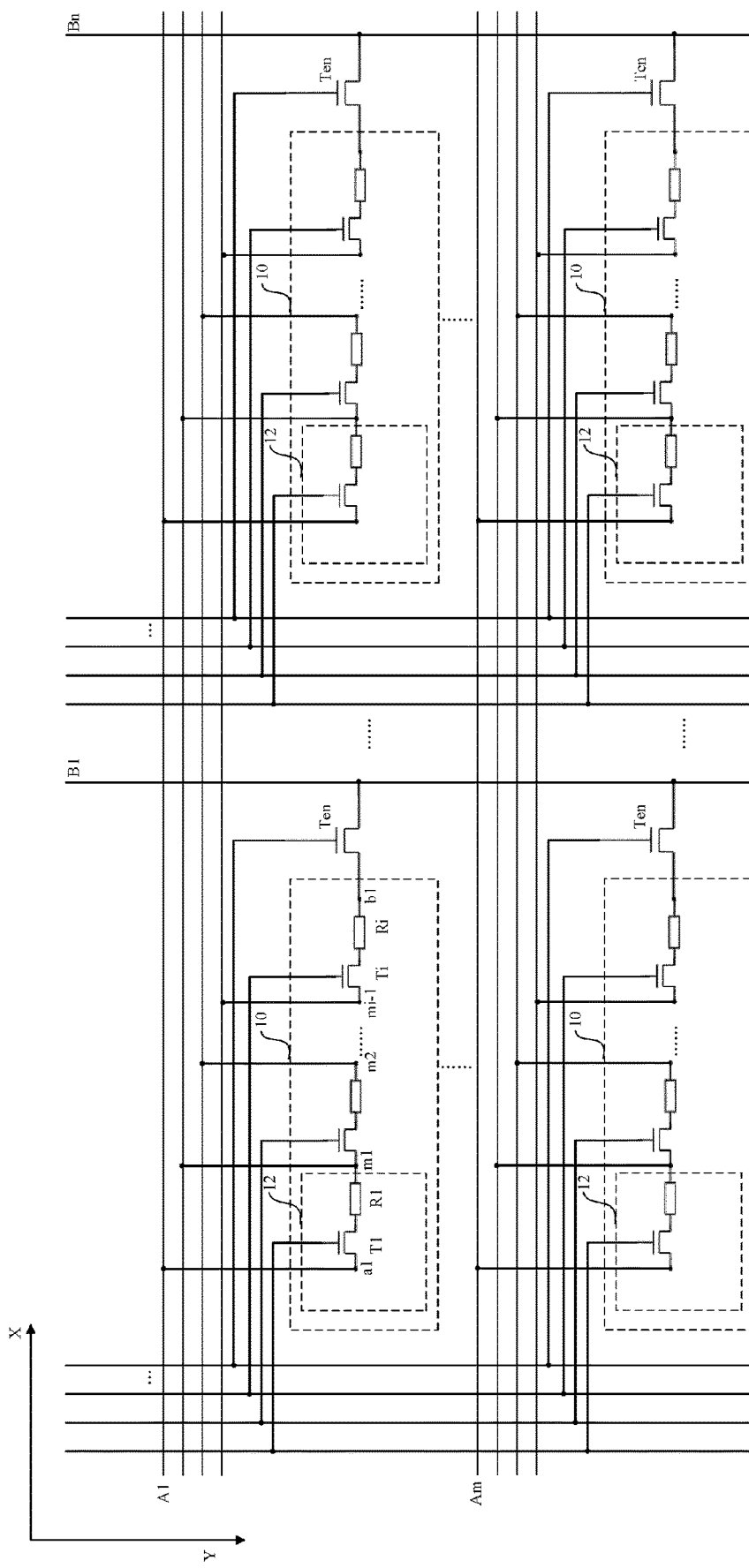
FIG. 4 shows a structural diagram of a compute-in-memory array according to Embodiment Two of the present disclosure.

In an embodiment of the present disclosure, as shown in FIGS. 1 and 4, a compute-in-memory array is formed by a plurality of storage cells 10 arranged in an array, and the array is composed of storage devices, which can be used for array computing, and typically can be used as a matrix operation of a neural network.

Figure 2:
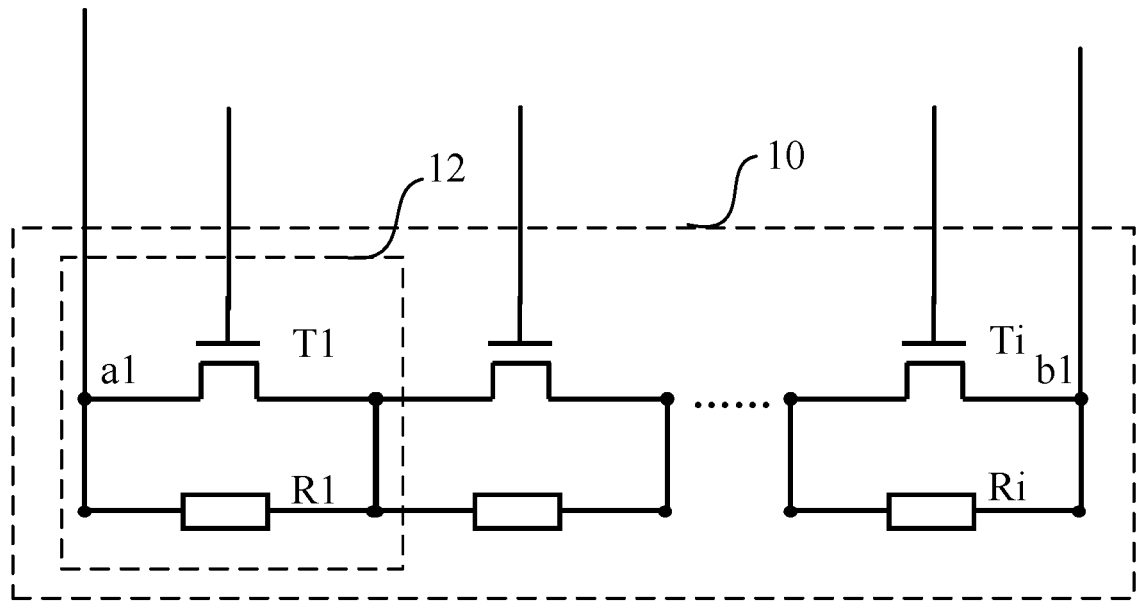
FIG. 2 shows a schematic diagram of the first structure of a storage cell in a compute-in-memory array according to Embodiment One of the present disclosure.
Figure 3:
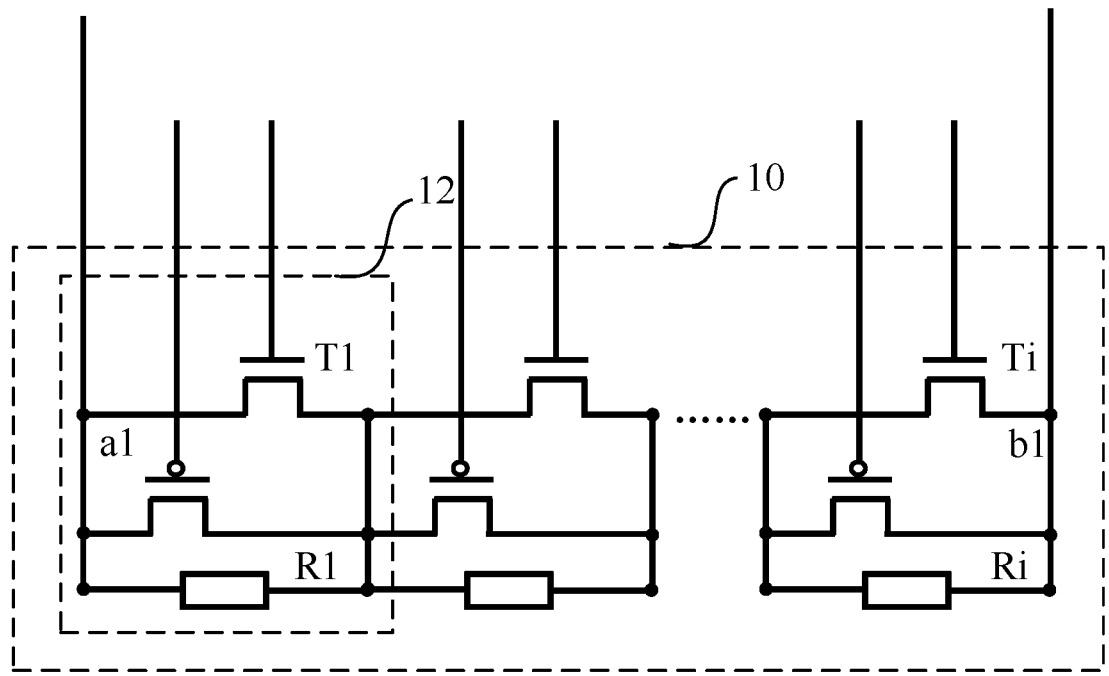
FIG. 3 shows a schematic diagram of the second structure of a storage cell in a compute-in-memory array according to Embodiment One of the present disclosure.
Figure 5:
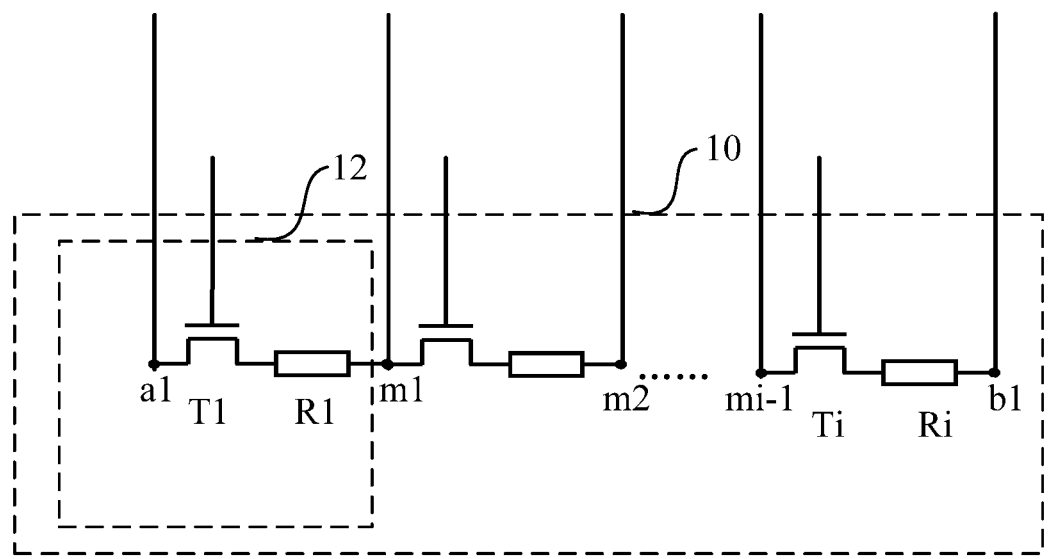
FIG. 5 shows a structural diagram of a storage cell in a compute-in-memory array according to Embodiment Two of the present disclosure.

The storage cell 10 includes a plurality of bitcells connected in series, and each bitcell 12 includes a switching device T and a resistive memory R. In some embodiments, as shown in FIGS. 1-3, the switching device T is connected in parallel with the resistive memory R, and in other embodiments, as shown in FIGS. 4 and 5, the switching device T is connected in series with the resistive memory R, and the resistive memory R has different resistance states, generally including a high impedance state and a low resistance state. The resistive memory R is used for storage and computation. The resistive memory R can be, for example, a resistive random access memory, a phase change memory, a ferroelectric memory or a magneto resistive memory.

The quantity and resistance state of the resistive memory R in the bitcell 12 can determine the amount of information that the storage cell can carry, that is, the accuracy of the storage cell. In specific applications, the quantity and resistance state of the resistive memory can be set according to specific requirements, and the quantity of the resistive memory can be, for example, 5, 8 or more.

The switching device T is a switching element, such as a MOS device, which has off and on switching states. The switching device is used to control the write resistance value of the storage cell, and does not need to be used for actual computation. By the state of the switching device, the resistance state of the resistive memory can be controlled. In this way, by controlling the resistance state of each resistive memory in the storage cell, the resistance value of the bitcell connected in series can be changed, so that the required resistance value can be written into the storage cell. For convenience of description, the serial resistance value of the bitcells determined by changing the resistance state of the resistive memory is recorded as the write resistance value of the storage cell in this application.

In the embodiment of the present disclosure, the first direction and the second direction are two directions of array arrangement, and the array is usually arranged in rows and columns. The size of the array is M*N, for example, and there are M rows and N columns of storage cells in the array. In the specific implementation, an appropriate array arrangement can be adopted as required, as shown in FIG. 1, for example, it can be arranged in aligned rows and columns, or it can be arranged in staggered rows and columns, that is, the storage cell of the next row is located between two storage cells of the previous row. In a specific embodiment, the first direction X is the row direction, and the second direction Y is the column direction. Correspondingly, the first direction X is the column direction, and the second direction Y is the row direction, with each row in the row direction and each column in the column direction.

Two ends of the storage cell 10 are signal terminals, one ends a are connected in turn in the first direction as the signal input terminals A of an array, and the other ends b are connected in turn in the second direction as the signal output terminal B of the array. The signal input terminal A is used for loading input signals, which can be electrical signals corresponding to sampling signals, such as sound, image or electromagnetic wave signals and the like collected by sensors. The sampling signals are usually time domain signals obtained according to a certain sampling frequency, and these sampling signals are converted into electrical signals, that is, electrical signals of sampling signals that change in the time domain. The electrical signals can be voltage or current signals, and the electrical signals are used for further signal processing.

When the compute-in-memory array is used for computation, the write resistance value of the storage cell is an operator of a matrix computation, and the write resistance value can be a value reflecting the weight. The input signal loaded on the signal input terminal of the storage cell in the first direction is another operator, which can be reflected as the electric signal value. For the storage cells in the second direction, the value equivalent to the electric signal is multiplied and summed with the weight, that is, the electric signal is calculated, so that the computation results of the electric signal are output at different signal output terminals.

In the embodiment of the application, since the resistive memory has different resistance states, the resistive memory can be set in different resistance states by means of the switching state of the switching device, so that the storage cell is at the required write resistance value, thus thereby enabling the quick implementation of a write operation of the bitcell.

In some embodiments, as shown in FIGS. 1-3, in the storage cell 10, the switching device T of each bitcell 12 is connected in parallel with the resistive memory R. When the resistance value is written into the storage cell, the signal input terminal and the signal output terminal at two ends of the storage cell are configured to connect a bias voltage, and the resistance state of the resistive memory can be changed under the bias voltage.

In a specific application, as shown in FIG. 1, one end a of the storage cell 10 can be connected to the signal input terminal A in the row direction, the other end b of the storage cell 10 can be connected to the signal output terminal B in the column direction, and the resistive memories Ri of each storage cell 10 can be connected to the same row control line in the row direction, and the row control line connected to the same resistive memory Ri can be connected to the same column control line in the column direction. In this way, the compute-in-memory array can support parallel reading and writing by rows, parallel computing by columns and parallel computing of the whole array.

As shown in FIG. 2, a power supply Vdd can be connected to the signal input terminal A of the storage cell, and the signal output terminal B of the storage cell can be grounded. When the resistance state of the resistive memory Ri needs to be changed, the switching device Ti connected in parallel with the resistive memory Ri can be controlled to be in an off state, and the other switching devices Tj(j≠i) are in an on state, so that the current flows through the resistive memory Ri to change its resistance state, thereby realizing the writing of the resistance value of the storage cell. When reading the write resistance value of the storage cell, all the switching devices in the storage cell are turned off, and the resistance values of the storage cells are read in series. This method has a wider voltage reading range and a faster writing speed.

In some embodiments, referring to FIG. 3, the switching device T of the bitcell 12 may be a transmission gate. The transmission gate is a parallel structure of PMOS and NMOS, in which the gate inputs of PMOS and NMOS are complementary signals. As the switching device T, the transmission gate can have two states: on and off, in which on corresponds to both PMOS and NMOS being on, and off corresponds to both PMOS and NMOS being off. The advantage of this structure is that it can use a lower gate voltage to obtain a smaller on-resistance.

In some embodiments, as shown in FIG. 4, in the storage cell 10, the switching device T is connected in series with the resistive memory R, and a signal terminal m may be arranged between the bitcells 12 in the storage cell. These signal terminals a1, b1, m are configured to connect the bias voltage and write the resistance value into the bitcells when writing the resistance value to the storage cell 10.

In an embodiment, one end a of the storage cell 10 can be connected to the signal input terminal A in the row direction, the other end b of the storage cell 10 can be connected to the signal output terminal B in the column direction, the resistive memories Ri of each storage cell 10 can be connected to the same row control line in the row direction, and the signal terminal m between the bitcells 12 can be connected to the column control line in the column direction. In this way, the compute-in-memory array can support parallel reading and writing by rows and parallel computing by columns.

In an embodiment, there may be a systematic error in the operation result output at the output terminal, which is caused by the constant leakage of the storage cells. The systematic error can be obtained at the output terminal by setting the write resistance value of the storage cells 10 in the second direction (such as the column direction) to a high impedance state (representing "0") and inputting a non-zero signal to the signal input terminals in the first direction (such as the row direction).

The compute-in-memory array may further include a correction unit, which is configured to remove the systematic error of the operation result at the output terminal to output the corrected operation result, the systematic error is the constant leakage of each storage cell in the second direction. In some embodiments, the correction unit may include a differential operator, which is used to perform a differential operation on the operation result and the operation results of another storage cell which are all in a high impedance state in the second direction, thereby outputting the operation result with the systematic error removed. In other embodiments, the correction unit may include a digital operation circuit for deducting the systematic error from the operation result.

Referring to FIG. 5, when the resistance state of the resistive memory Ri needs to be changed, the switching device Ti connected in series with the bitcell Si of the resistive memory Ri can be controlled to be in a conducting state, while the switching devices in the adjacent bitcells are in an off state, and the resistance state of the resistive memory RI can be changed by connecting the bias voltage to the signal terminals at two ends of the bitcell Si, thereby realizing the writing of the resistance value of the storage cell. When reading the written resistance of the storage cell, all the switching devices in the storage cell are turned on, and the resistance values of the storage cells are read in series. More preferably, all bitcells can be read and written in an even-odd staggered way, that is, writing and reading can be completed in one clock cycle in parallel for the bitcells with odd serial numbers, and writing and reading can be completed in one clock cycle in parallel for the bitcells with even serial numbers. This method has a faster writing speed, can realize fast writing and reading, and realize fast online training.

Figure 6:
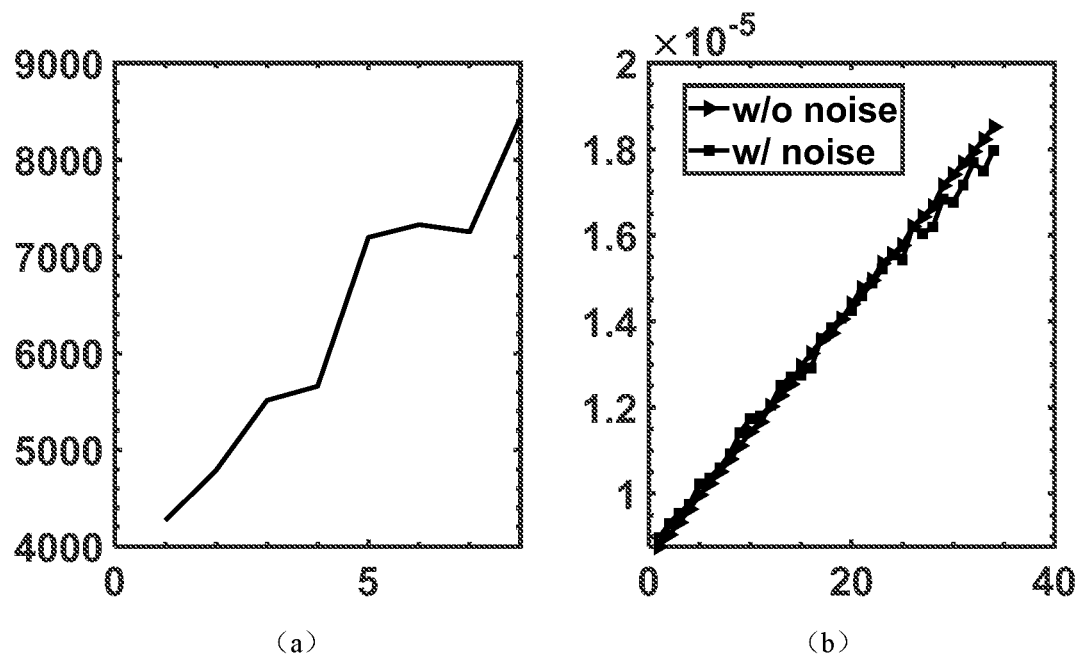
FIG. 6 shows a schematic diagram showing the resistance state and accuracy of a storage cell in a compute-in-memory array according to an embodiment of the present disclosure.

In addition, in the embodiment of the present disclosure, various resistive memories in the storage cell can have different resistance values, so that the amount of information that can be carried by the series resistances of the storage cells can be increased after being connected in series. In an example, refer to FIG. 6, where FIG. (a) shows the resistance states of the resistive memories in different bitcells, where the horizontal axis is the number of bitcells and the vertical axis is the conductance value, there are 8 bitcells in a storage cell, and the resistance states of the resistive memories in each bitcell are different; FIG. (b) shows that different series resistance values can be combined from different resistance states of these resistive memories, where the horizontal axis is the number of combinations of the storage cells, and the vertical axis is the series conductance value of the storage cells. Through these different resistance states, different series resistance values can be combined. In the process of selecting the determined resistance values, more robust and reasonable data can be selected as the determined combination of resistance values from more series resistance values than 8 bits, so as to realize stable 8-bit storage.

The end of the storage cell is also connected in series with an enabling device Ten, which is configured to control the on-state of the storage cell. When the enabling device is controlled by a non-enabling signal, the storage cell will always be off. The non-enabling signal can correspond to the preset write resistance value, and when it is less than the preset write resistance value, the storage cell will always be off. the enabling signal can be stored by providing a certain bit of information. In the case of non-enabling, the storage cell will always be off. In this way, the sparsity of the neural network can be utilized to reduce the operation power consumption of the array.

In some embodiments, the enabling device Ten may be a transmission gate. The transmission gate is a parallel structure of PMOS and NMOS, in which the gate inputs of PMOS and NMOS are complementary signals. As the enabling device Ten, the transmission gate can have two states: on and off, in which on corresponds to both PMOS and NMOS being on, and off corresponds to both PMOS and NMOS being off. The advantage of this structure is that it can use a lower gate voltage to obtain a smaller on-resistance.

The compute-in-memory array of the embodiment of the present disclosure is described in detail. In addition, the present disclosure also provides a data computing method, which uses the compute-in-memory array to perform computation. The computing method includes:

Controlling writing of the storage cells, the writing includes: changing the resistance state of the resistive memory by controlling the switching state of the switching device to obtain a write resistance value of the storage cell.

Loading an input signal at the signal input terminal, and obtaining an output value from the signal output terminal, the output value is used to represent a computed value.

As described in the above embodiment, since the resistive memories have different resistance states, each resistive memory can also have different resistance values, and the resistive memories can be in different resistance states by means of the switching state of the switching device, so that the storage cells can be at the required write resistance values, thereby enabling the quick implementation of a write operation of the bitcell.

In some embodiments, in the storage cell, the switching device is connected in parallel with the resistive memory, and when the resistance value is written into the storage cell, the signal input terminal and the signal output terminal at two ends of the storage cell are configured to connect the bias voltage, under which the resistance state of the resistive memory can be changed.

In other embodiments, in the storage cell, the switching device is connected in series with the resistive memory, and a signal terminal may be arranged between the bitcells in the storage cell, and these signal terminals are configured to connect the bias voltage and write the resistance value to the bitcell when writing the resistance value to the storage cell.

In the embodiment where the switching device is connected in series with the resistive memory, a correction step may be further included, in which a systematic error of the operation result at the output terminal is removed to output the corrected operation result, and the systematic error is the constant leakage of each storage cell in the second direction. A differential amplifier can be configured to remove the systematic error, that is, the output of the differential operation between the analog value of the operation result and the analog value of the systematic error is the corrected operation result, and the corrected operation result is the analog value. A digital operation circuit can also be configured to remove the systematic error, that is, the digital signal corresponding to the systematic error is deducted from the numerical value after the operation result is converted into a digital signal, and the corrected operation result is a digital signal.

Figure 7:
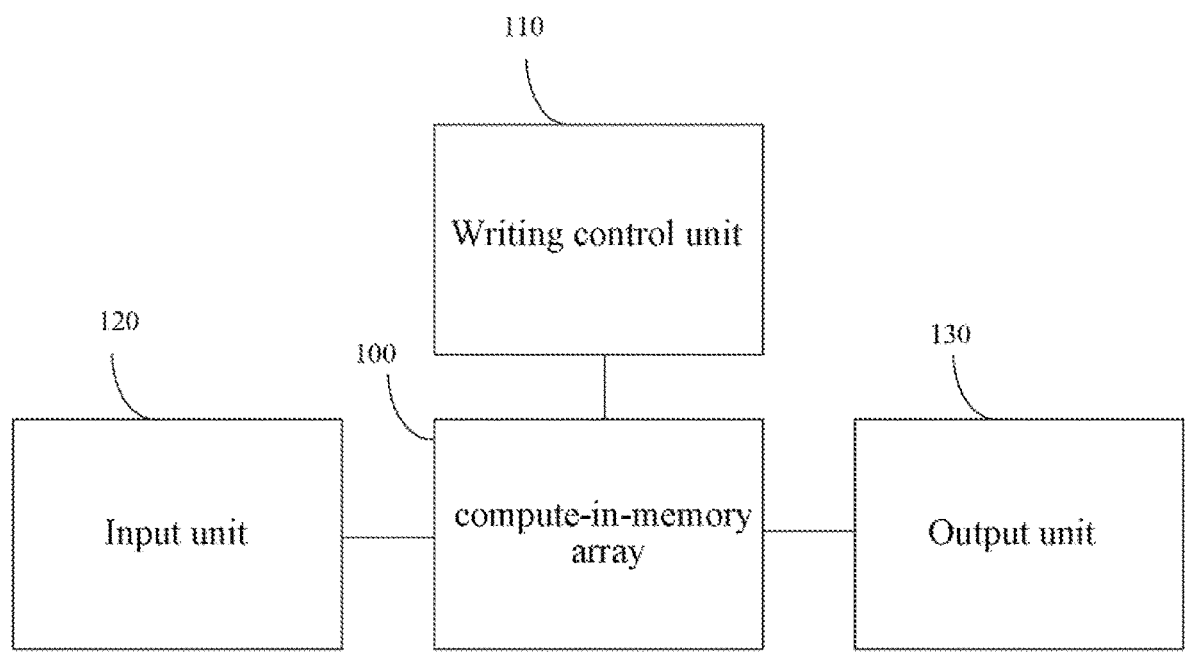
FIG. 7 shows a structural diagram of a storage device according to an embodiment of the present disclosure.

In addition, the application also provides a storage device, as shown in FIG. 7, including:

A compute-in-memory array 100 described above.

A writing control unit 110 configured to control the writing of the storage cells, the writing includes changing the resistance states of different resistive memories by controlling the switching state of the switching device to obtain the write resistance value of the storage cell.

An input unit 120 for loading an input signal at a signal input terminal.

an output unit 130 configured to obtain an output value from a signal output terminal, the output value is used for representing a computed value.

All the embodiments in this description are described in a progressive way, and the same and similar parts of each embodiment can be referred to each other, and the differences between each embodiment and other embodiments are highlighted. Especially, as for the device embodiment, it is basically similar to the method embodiment, so the description is relatively simple. Please refer to part of the description of the method embodiment for the relevant information.

The above is only the preferred embodiment of the present disclosure. Although the present disclosure has been disclosed in the preferred embodiment, it is not intended to limit the present disclosure. Anyone who is familiar with the art can make many possible changes and modifications to the technical solution of the present disclosure by using the above disclosed methods and technical contents without departing from the scope of the technical solution of the present disclosure, or modify them into equivalent embodiments with equivalent changes. Therefore, any simple modifications, equivalent changes and modifications made to the above embodiments according to the technical essence of the present disclosure that do not depart from the content of the technical solution of the present disclosure are still within the scope of protection of the technical solution of the present disclosure

What is claimed is:

1. A compute-in-memory array, comprising:
   storage cells arranged in an array, wherein each of the storage cells comprises a plurality of bitcells connected in series, each of the plurality of bitcells comprises a switching device and a resistive memory, and wherein the switching device is connected in series or in parallel with the resistive memory, and a write resistance value of the storage cell is determined by controlling a switching state of the switching device to change a resistance state of the resistive memory; and
   signal terminals connected with two ends of the storage cells in the array, respectively, wherein the signal terminals at one end of the storage cells are signal input terminals and connected in sequence along a first direction, and the signal terminals at the other end of the storage cells are signal output terminals and connected in sequence along a second direction.

2. The compute-in-memory array according to claim 1, wherein the resistive memory comprises a resistive random access memory, a phase change memory, a ferroelectric memory or a magneto resistive memory.

3. The compute-in-memory array according to claim 1, wherein the switching device is connected in parallel with the resistive memory, and when a resistance value is written into the storage cell, the signal input terminal and the signal output terminal are configured to connect with a bias voltage.

4. The compute-in-memory array according to claim 1, wherein the switching device is connected in series with the resistive memory, and a signal terminal is provided between the bitcells in the storage cell; when the resistance value is written into the storage cell, the signal terminals at two ends of the bitcell are configured to connect with the bias voltage and write the resistance value into the bitcell.

5. The compute-in-memory array according to claim 4, wherein when the resistance value is written into the storage cell, the reading and writing of all the bitcells are completed in an even-odd staggered manner.

6. The compute-in-memory array according to claim 1, further comprising a correction unit, wherein the correction unit is configured to remove a systematic error of an operation result at the output terminal to output a corrected operation result, and the systematic error is a constant leakage of each storage cell in the second direction.

7. The compute-in-memory array according to claim 1, wherein each resistive memory has a different resistance state value.

8. The compute-in-memory array according to claim 1, further comprising an enabling device connected in series with the storage cells, wherein the enabling device is configured to cause the storage cell to be in an off state in a case of an enabling signal.

9. The compute-in-memory array according to claim 8, wherein the enabling device is a single MOS device or a CMOS transmission gate.

10. The compute-in-memory array according to claim 1, wherein the switching device is a single MOS device or a CMOS transmission gate.

11. A storage device, comprising:
    the compute-in-memory array according to claim 1;
    a writing control unit configured to control the writing of a storage cell, wherein the writing comprises: changing the resistance states of different resistive memories by controlling the switching state of a switching device to obtain a write resistance value of the storage cell;
    an input unit configured to load an input signal at a signal input terminal; and
    an output unit configured to obtain an output value from a signal output terminal, wherein the output value is used for representing a computed value.

12. A data computing method wherein computing method is carried out by a compute-in-memory array, and wherein the compute-in-memory array comprises:
    storage cells arranged in an array, wherein each of the storage cells comprises a plurality of bitcells connected in series, each of the bitcells comprises a switching device and a resistive memory, the switching device is connected in series or in parallel with the resistive memory; and
    signal terminals connected with two ends of the storage cells in the array, wherein the signal terminals at one end of the storage cells are signal input terminals and connected in sequence along a first direction, and the signal terminals at the other end of the storage cells are signal output terminals and connected in sequence along a second direction;
    wherein the computing method comprises the following steps:
    controlling writing of the storage cells, wherein the writing comprises: changing a resistance state of the resistive memory by controlling a switching state of the switching device to obtain a write resistance value of the storage cell;
    loading an input signal at the signal input terminal; and
    obtaining an output value from the signal output terminal, wherein the output value is configured to represent a computed value.

13. The computing method according to claim 12, wherein the switching device is connected in parallel with the resistive memory, and when writing of the storage cell is implemented, the signal input terminal and the signal output terminal are configured to connect a bias voltage.

14. The computing method according to claim 12, wherein the switching device is connected in series with the resistive memory, and a signal terminal is provided between the bitcells in the storage cell; and wherein writing of the storage cell is implemented, the signal terminals at two ends of the bitcells are configured to connect the bias voltage and write the resistance value to the bitcell.

15. The computing method according to claim 12, wherein each resistive memory has a different resistance value.

* * * * *